United States Patent
Yamada

(10) Patent No.: US 10,416,229 B2
(45) Date of Patent: Sep. 17, 2019

(54) WAFER INSPECTION METHOD AND WAFER INSPECTION DEVICE

(71) Applicant: TOKYO ELECTRON LIMITED, Tokyo (JP)

(72) Inventor: Hiroshi Yamada, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/763,312

(22) PCT Filed: Jul. 11, 2016

(86) PCT No.: PCT/JP2016/070923
§ 371 (c)(1),
(2) Date: Mar. 26, 2018

(87) PCT Pub. No.: WO2017/056643
PCT Pub. Date: Apr. 6, 2017

(65) Prior Publication Data
US 2018/0275192 A1   Sep. 27, 2018

(30) Foreign Application Priority Data
Sep. 30, 2015   (JP) ................. 2015-194390

(51) Int. Cl.
  *G01R 31/00*   (2006.01)
  *G01R 31/28*   (2006.01)
  *H01L 21/68*   (2006.01)
(52) U.S. Cl.
  CPC .......... *G01R 31/2891* (2013.01); *H01L 21/68* (2013.01); *G01R 31/2865* (2013.01)

(58) Field of Classification Search
CPC .... G01R 31/26; G01R 31/28; G01R 31/2601; G01R 31/2831; G01R 31/2891; G01R 31/2865; G01R 31/2893; G01R 31/2868; G01R 31/2887; G01R 31/2867; G01R 31/2874; G01R 31/2851; G01R 1/04; G01R 1/067; G01R 1/06794; G01R 1/0491
See application file for complete search history.

(56) References Cited

U.S. PATENT DOCUMENTS

| | | | |
|---|---|---|---|
| 5,410,259 A * | 4/1995 | Fujihara ............ | G01R 1/07314 324/750.23 |
| 9,689,916 B2 * | 6/2017 | Yamada ............. | G01R 31/2891 |
| 9,977,053 B2 * | 5/2018 | Appinger ........... | G01R 1/06794 |

(Continued)

FOREIGN PATENT DOCUMENTS

| | | |
|---|---|---|
| JP | H11-251379 A | 9/1999 |
| JP | 201475420 A | 4/2014 |
| KR | 10-2012-0028282 A | 3/2012 |

*Primary Examiner* — Thang X Le
(74) *Attorney, Agent, or Firm* — Nath, Goldberg & Meyer; Jerald L. Meyer

(57) ABSTRACT

Provided is a wafer inspection method wherein a chuck top can be properly received. When an aligner receives a chuck top after a wafer W has been inspected, the distance between the chuck top and a chuck base is adjusted by adjusting the inclination of the chuck base such that the chuck top height, which is the distance between the chuck top and the chuck base after the chuck top is held, is a height in which any of 0 to 200 μm is added to the chuck top height before the chuck top is held.

10 Claims, 10 Drawing Sheets

(56) References Cited

U.S. PATENT DOCUMENTS

| | | | |
|---|---|---|---|
| 2009/0219046 A1* | 9/2009 | Yamada | G01R 31/2891 324/756.03 |
| 2015/0137842 A1* | 5/2015 | Murakami | G01R 1/067 324/750.03 |
| 2015/0219687 A1* | 8/2015 | Furuya | G01R 1/07307 324/756.03 |

* cited by examiner

WAFER INSPECTION METHOD AND WAFER INSPECTION DEVICE

This is a National Phase Application filed under 35 U.S.C. 371 as a national stage of PCT/JP2016070923, filed Jul. 11, 2016, an application claiming the benefit of Japanese Application No. 2015-194390, filed Sep. 30, 2015, the content of each of which is hereby incorporated by reference in its entirety.

TECHNICAL FIELD

The present disclosure relates to a wafer inspection method and a wafer inspection device using a probe card for wafer inspection.

BACKGROUND

A prober used as an inspection device for inspecting a wafer, on which a large number of semiconductor devices is formed, includes a probe card having a plurality of columnar contact terminals acting as contact probes. The wafer is brought into contact with the probe card bringing each contact probe into contact with an electrode pad or a solder bump in the semiconductor device, and an electric current flows to an electric circuit of the semiconductor device connected to the electrode pad or the solder bump, thereby inspecting the conduction state or the like of the electric circuit.

In recent years, in order to improve wafer inspection efficiency, a wafer inspection device has been developed which includes a plurality of probe cards and can inspect a semiconductor device of a wafer with one probe card while another wafer is transferred to another probe card by a transfer stage. In this wafer inspection device, a wafer W is loaded on a chuck top 90, which is a thick plate member (see FIG. 10A), and a space between a probe card 91 and the chuck top 90 is evacuated so that the wafer W is brought into contact with the probe card 91 together with the chuck top 90 (see FIG. 10B), thereby preventing the wafer from warping when the wafer is brought into contact with the probe card (see, for example, Patent Document 1). Here, when the wafer W is brought into contact with the probe card 91, the chuck top 90 is mounted on a stage 92, and the stage 92 moves the chuck top 90 toward the probe card 91. Thereafter, the chuck top 90 is adsorbed by the probe card 91 and separated from the stage 92.

However, inspection conditions for wafer inspection have become complicated in recent years, and, in particular, many inspections are carried out in a high-temperature or low-temperature environment.

PRIOR ART DOCUMENTS

Patent Document

Patent Document 1: Japanese Patent Laid-Open Publication No. 2014-75420

However, in a high-temperature environment or low-temperature environment, there is a possibility that the probe card 91 or the adsorbed chuck top 90 is deformed due to thermal expansion or thermal shrinkage, and as a result, the adsorbed chuck top 90 may be inclined (FIG. 11A). In addition, when the center of gravity of the chuck top 90 deviates from the center of the probe card 91, the attracted chuck top 90 may also be inclined (FIG. 11A).

When wafer inspection is completed, the stage 92 approaches the probe card 91 and receives the wafer W together with the chuck top 90 (FIG. 11B). In principle, the stage 92 is maintained in a horizontal position. Thus, if the adsorbed chuck top 90 is inclined, when the evacuation of the space between the probe card 91 and the chuck top 90 is completed and the chuck top 90 is lowered toward the stage 92, the chuck top 90 makes local contact with the stage 92 (FIG. 11C), so that the chuck top 90 deviates with respect to the stage 92 or the probe card 91 and the contact probe is caught on the wafer W. As a result, a needle trace may remain on the wafer W. That is to say, there is a problem in that the chuck top 90 cannot be appropriately received.

SUMMARY

The present disclosure provides some embodiments of a wafer inspection method and a wafer inspection device capable of appropriately receiving a chuck top.

According to one embodiment of the present disclosure, there is provided a wafer inspection method in which a wafer mounted on a chuck top is brought into contact with a probe card having a plurality of contact terminals. The method includes: storing, before the wafer is in contact with the probe card, a relative positional relationship between the chuck top and an aligner, which adjusts an inclination of the chuck top, when the chuck top is attached to the aligner; inspecting the wafer by moving the chuck top so that the wafer makes contact with the probe card; adjusting, after inspecting the wafer, a distance between the aligner and the chuck top, on which the wafer in contact with the probe card is mounted, based on the relative positional relationship stored; and receiving, by the aligner, the chuck top together with the wafer.

According to another embodiment of the present disclosure, there is provided a wafer inspection device in which a wafer mounted on a chuck top is brought into contact with a probe card having a plurality of contact terminals. The device includes: an aligner configured to adjust an inclination of the chuck top; and a sensor configured to measure a relative positional relationship between the chuck top and the aligner. The aligner is allowed to be separated from the chuck top. The sensor measures, before the wafer makes contact with the probe card, the relative positional relationship between the aligner and the chuck top when the chuck top is attached to the aligner. The probe card inspects the wafer when the chuck top is moved so that the wafer is in contact with the probe card. The aligner receives, after the wafer is inspected, the chuck top together with the wafer by adjusting a distance between chuck top, on which the wafer in contact with the probe card is mounted, and the aligner based on the relative positional relationship measured.

According to the present disclosure, when an aligner receives a chuck top together with a wafer, the distance between the chuck top and the aligner is adjusted based on the relative positional relationship between the chuck top and the aligner when the chuck top is provided in the aligner, so that it is possible to reproduce the relative positional relationship between the chuck top and the aligner when the chuck top is provided in the aligner. As a result, it is possible to prevent the chuck top from locally coming into contact with the aligner, thereby appropriately receiving the chuck top.

BRIEF DESCRIPTION OF THE DRAWINGS

FIG. 7 is a view showing a state in which the chuck top is mounted on the aligner before the chuck top is adsorbed to a probe card or the like;

DETAILED DESCRIPTION

Hereinafter, embodiments of the present disclosure will be described with reference to the accompanying drawings.

First, a wafer inspection device for performing a wafer inspection method according to the present embodiment will be described.

Figure 1:
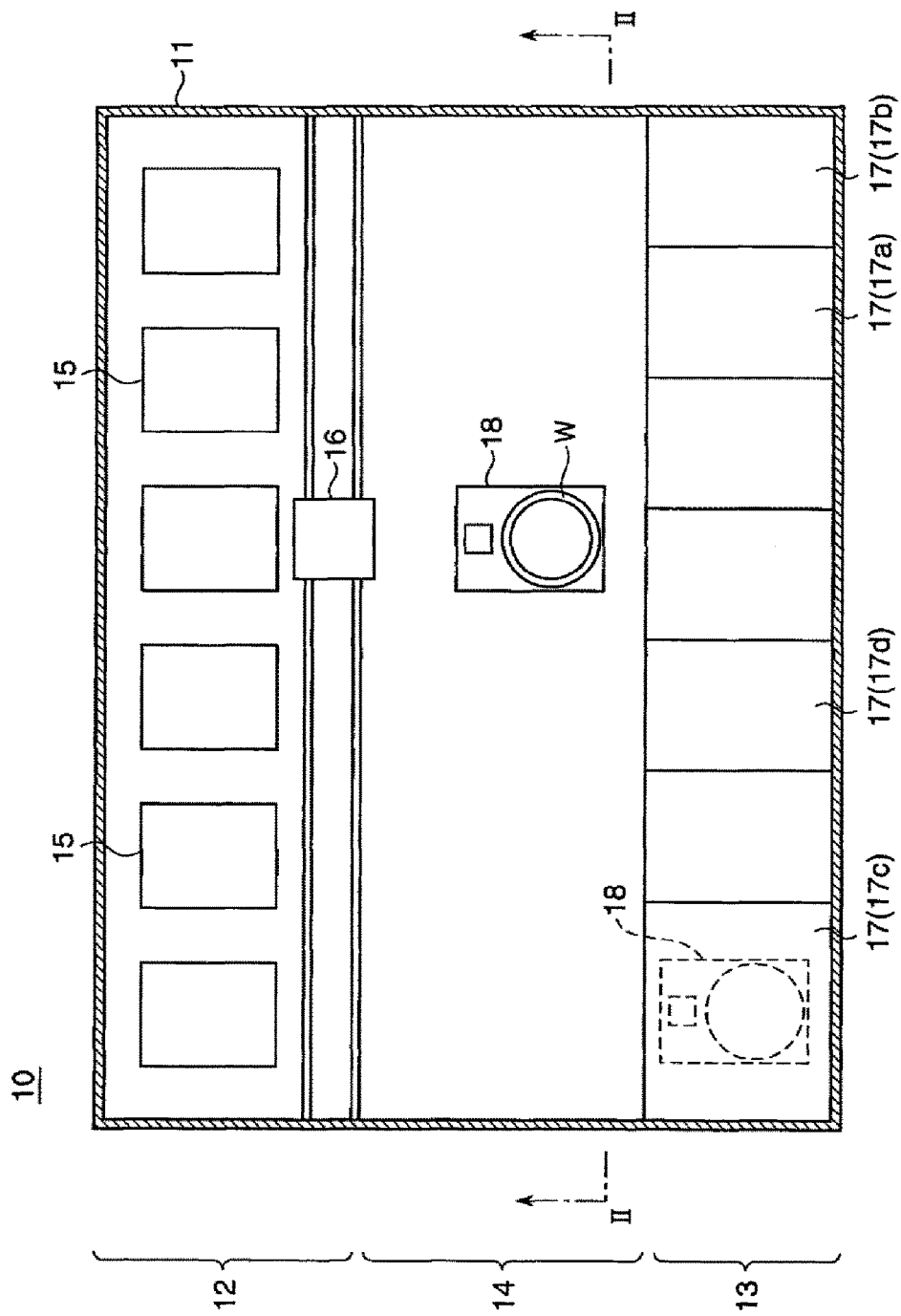
FIG. 1 is a horizontal sectional view schematically showing a configuration of a wafer inspection device for performing a wafer inspection method according to an embodiment of the present disclosure.
Figure 2:
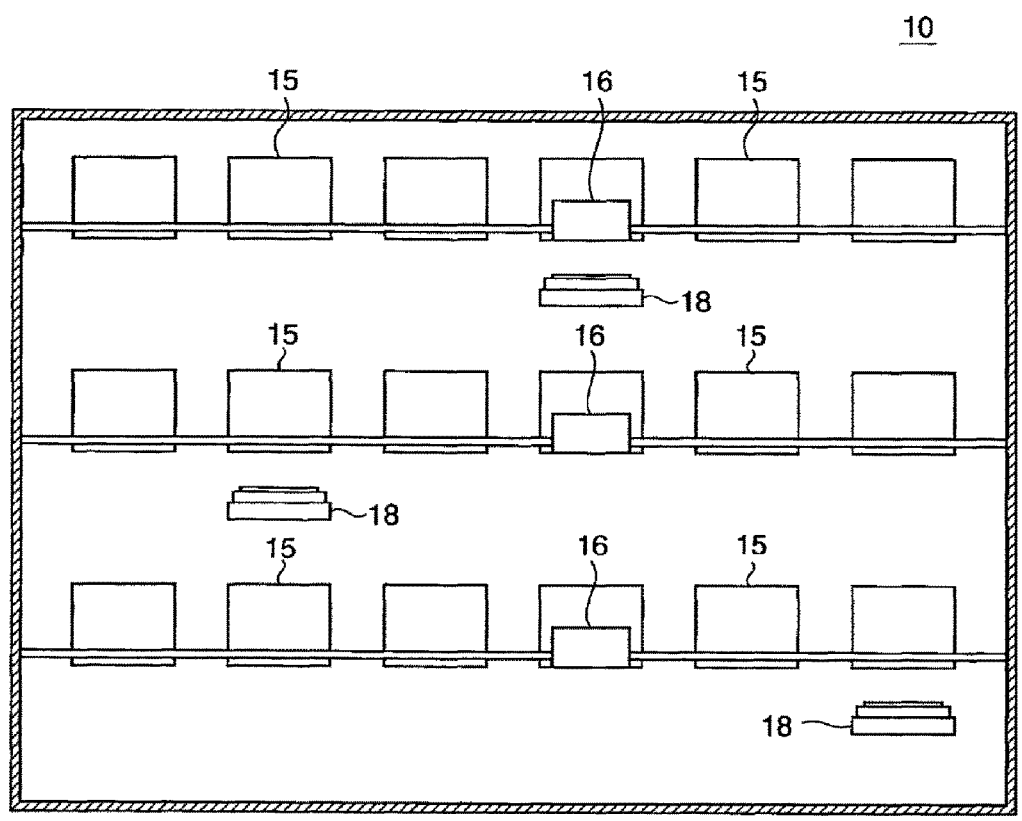
FIG. 2 is a cross-sectional view taken along a line II-II in FIG. 1.

FIG. 1 is a horizontal sectional view schematically showing a configuration of a wafer inspection device for performing a wafer inspection method according to an embodiment of the present disclosure, and FIG. 2 is a cross-sectional view taken along line II-II in FIG. 1.

In FIGS. 1 and 2, a wafer inspection device 10 includes an inspection chamber 11. The inspection chamber 11 includes an inspection region 12 for inspecting electrical characteristics of each semiconductor device of a wafer W, a loading/unloading region 13 for loading and unloading the wafer W with respect to the inspection chamber 11, and a transfer region 14 provided between the inspection region 12 and the loading/unloading region 13.

In the inspection region 12, testers 15 serving as a plurality of wafer inspection interfaces are arranged. Specifically, the inspection region 12 has a three-layer structure of tester rows made up of a plurality of horizontally arranged testers, and one tester-side camera 16 is arranged to correspond to each of the tester rows. Each tester-side camera 16 horizontally moves along the corresponding tester row, is positioned in front of each tester 15 constituting the tester row, and determines a position of the wafer W or the like transferred by a transfer stage 18, which will be described later, or a degree of inclination of a chuck top 29, which will be described later.

The loading/unloading region 13 is partitioned into a plurality of accommodating spaces 17. In each accommodating space 17, a port 17a for receiving a FOUP as a container for accommodating a plurality of wafers, an aligner 17b for aligning the wafers, a loader 17c in which a probe card 19 is loaded and unloaded, and a controller 17d for controlling operation of each component of the wafer inspection device 10 are arranged.

In the transfer region 14, the transfer stage 18, which is movable not only to the transfer region 14 but also to the inspection region 12 or the loading/unloading region 13, is arranged. One transfer stage 18 is installed to correspond to each tester row, and receives the wafer W from the port 17a of the loading/unloading region 13 and transfers the received wafer W to each tester 15. The transfer stage 18 transfers the wafer W, for which electrical characteristics of the semiconductor device have been inspected, from each tester 15 to the port 17a.

In the wafer inspection device 10, each tester 15 inspects electrical characteristics of each semiconductor device of the transferred wafer W. While the transfer stage 18 transfers the wafer W toward one tester 15, another tester 15 may inspect electrical characteristics of each semiconductor device of another wafer W. Thus, inspection efficiency of the wafers can be improved.

Figure 3:
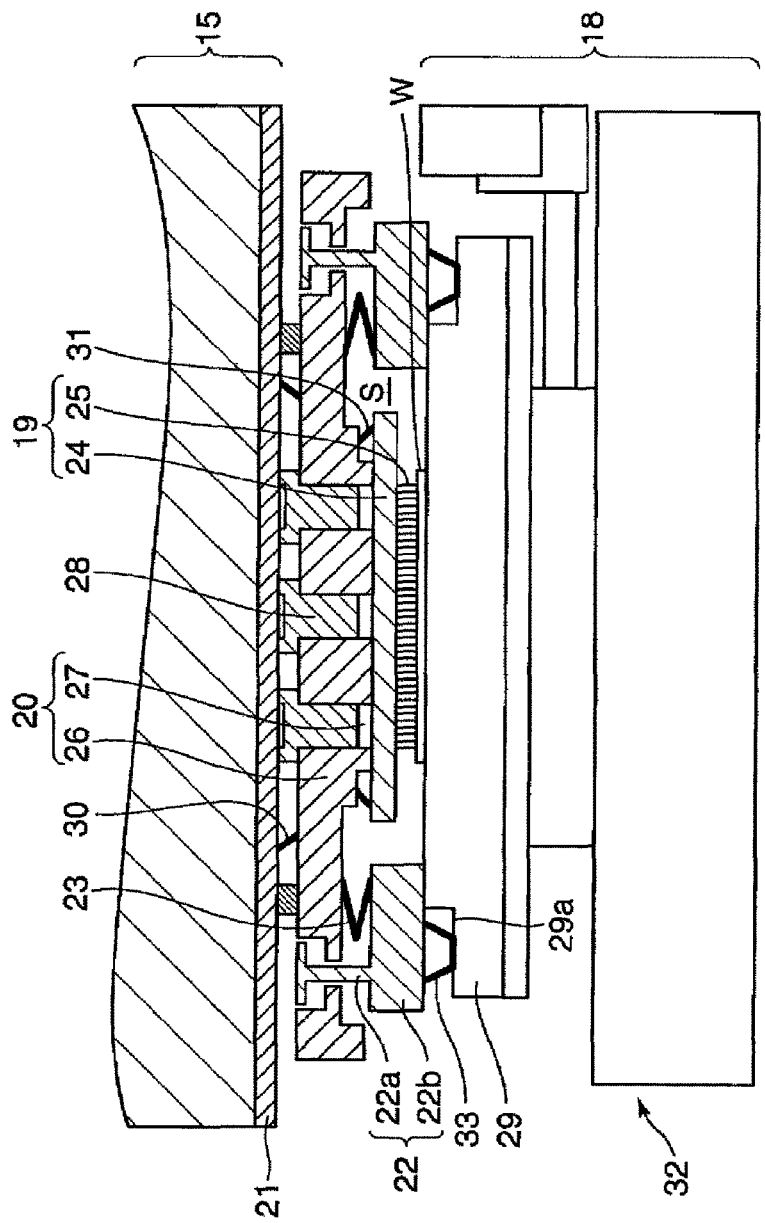
FIG. 3 is a side view schematically showing configurations of a transfer stage and a tester in FIGS. 1 and 2.

FIG. 3 is a side view schematically showing configurations of a transportation stage and a tester in FIGS. 1 and 2. FIG. 3 shows a state in which the wafer W is brought into contact with the probe card 19 of the tester 15 by the transfer stage 18, and shows mainly the configuration of the tester 15 as a sectional view.

In FIG. 3, the tester 15 is installed on a pogo frame 20 fixed to a device frame (not shown). The probe card 19 is mounted below the pogo frame 20. A flange 22, which is movable in the vertical direction with respect to the pogo frame 20, is engaged with the pogo frame 20. A cylindrical bellows 23 is interposed between the pogo frame 20 and the flange 22.

The probe card 19 includes a disk-shaped main body 24, a plurality of electrodes (not shown) arranged on substantially the entire upper surface of the main body 24, and a plurality of contact probes 25 (contact terminals) arranged so as to protrude downward in the drawing from the lower surface of the main body 24. Each electrode is connected to a corresponding contact probe 25. When the wafer W is brought into contact with the probe card 19, each contact probe 25 makes contact with an electrode pad or a solder bump of each semiconductor device formed on the corresponding wafer W.

The pogo frame 20 includes a substantially flat plate-like main body 26 and pogo block insertion holes 27, which are a plurality of through-holes bored in the vicinity of the center portion of the main body 26. A pogo block 28 with a plurality of pogo pins arranged therein is inserted into each of the pogo block insertion holes 27. The pogo block 28 is connected to an inspection circuit (not shown) included in the tester 15, while making contact with the plurality of electrodes which is formed on the upper surface of the main body 24 of the probe card 19 mounted on the pogo frame 20. The pogo block 28 supplies an electric current, which flows from an electric circuit of each semiconductor device of the wafer W via each contact probe 25, toward the inspection circuit, while supplying an electric current to each contact probe 25 of the probe card 19 connected to the corresponding electrode.

The flange 22 includes a cylindrical main body 22a and a contact portion 22b, which is an annular member formed at a lower portion of the main body 22a, and is arranged so as to surround the probe card 19. As will be described later, until the chuck top 29 makes contact with the flange 22, the flange 22 moves downward by its own weight such that the lower surface of the contact portion 22b is positioned lower than the tip end of each contact probe 25 of the probe card 19. The bellows 23 is a bellows structure made of metal and configured to be expandable and contractible in the vertical direction. The lower end and the upper end of the bellows 23 are in close contact with the upper surface of the contact portion 22b of the flange 22 and the lower surface of the pogo frame 20, respectively.

In the tester 15, a space between the pogo frame 20 and a base 21 is sealed with a sealing member 30, and the pogo frame 20 is attached to the base 21 by evacuating the space. A space between the pogo frame 20 and the probe card 19 is also sealed with a sealing member 31, and the probe card 19 is attached to the pogo frame 20 by evacuating the space.

The transfer stage 18 is configured by the chuck top 29, which is a thick plate member, and an aligner 32 (inclination adjusting mechanism). The chuck top 29 is mounted on the aligner 32, and the wafer W is mounted on the upper surface of the chuck top 29. The chuck top 29 is vacuum-adsorbed to the aligner 32, and the wafer W is vacuum-adsorbed to the chuck top 29. Therefore, it is possible to prevent the wafer W from moving relative to the transfer stage 18 when the transfer stage 18 moves. The method of holding the chuck top 29 or the wafer W is not limited to vacuum-adsorption, and may be any method capable of preventing the chuck top 29 or the wafer W from moving relative to the aligner 32. For example, the chuck top 29 or the wafer W may be held using electromagnetic adsorption or clamping. A step 29a is formed on a peripheral portion of the upper surface of the chuck top 29, and a sealing member 33 is arranged on the step 29a.

Since the transfer stage 18 is movable, it is possible to move to the transfer stage 18 to an area below the probe card 19 of the tester 15 so the wafer W mounted on the chuck top 29 faces the probe card 19, and to move the transfer stage 18 toward the tester 15. A space S, which is a space formed when the chuck top 29 makes contact with the contact portion 22b of the flange 22 and the wafer W, is brought into contact with the probe card 19, is surrounded by the chuck top 29, the flange 22, the pogo frame 20, and the probe card 19, and is sealed by the bellows 23 and the sealing member 33. By evacuating the space S, the chuck top 29 is held by the probe card 19, and the wafer W mounted on the chuck top 29 is brought into contact with the probe card 19. At this time, each electrode pad or solder bump in each semiconductor device of the wafer W is brought into contact with each contact probe 25 of the probe card 19. In the wafer inspection device 10, the movement of the transfer stage 18 is controlled by the controller 17d, and the controller 17d ascertains the position or movement amount of the transfer stage 18.

Moreover, in response to the complication of inspection conditions for wafer inspection, the probe card 19 (precisely, the pogo frame 20) or the chuck top 29 of each tester 15 is provided with a built-in temperature control mechanism such as a heater or a coolant passage (none of them shown), thereby realizing inspection in a high-temperature environment or a low-temperature environment. In such inspection in a high-temperature environment or a low-temperature environment, there is a possibility that the probe card 19 or the chuck top 29 becomes deformed due to heat radiation from a built-in heater or heat absorption by the coolant passage, and as a result, the probe card 19 and the chuck top 29 may be inclined. In this case, it may be difficult to keep the wafer W mounted on the chuck top 29 in parallel with the probe card 19. In response to this, in the wafer inspection device 10, the aligner 32 adjusts the relative inclination of the chuck top 29 with respect to the probe card 19.

Figure 4:
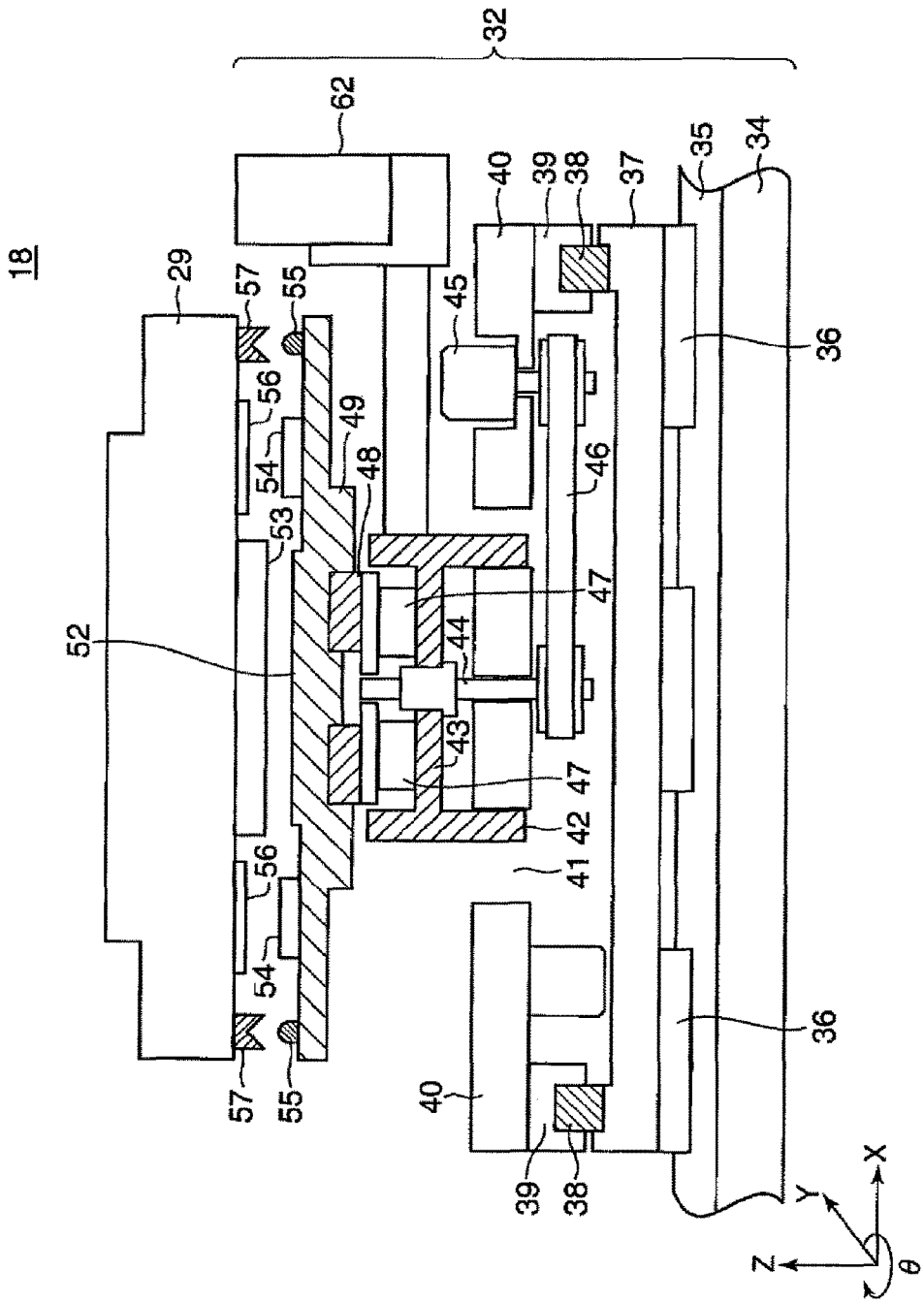
FIG. 4 is a view for explaining the configuration of the transfer stage in FIG.

FIG. 4 is a diagram for explaining the configuration of the transfer stage in FIG. 3. For ease of understanding, the interior of the aligner 32 is illustrated in perspective, and the chuck top 29 is illustrated as being spaced apart from the aligner 32. In the drawing, the horizontal direction is defined as an X direction, the vertical direction is defined as a Z direction, the depth direction is defined as a Y direction, and a rotation direction around an axis in the Z direction is defined as a θ direction.

In FIG. 4, the aligner 32 includes an X base 34 of a plate-like member, a rail-shaped X guide 35 extending in the X direction on the X base 34, a plurality of X blocks 36 engaged with the X guide 35 to be movable in the X direction, a Y base 37 of a plate-like member supported by each X block 36, a rail-shaped Y guide 38 extending in the Y direction on the Y base 37, a plurality of Y blocks 39 engaged with the Y guide 38 to be movable in the Y direction, and a Z base 40 of a plate-like member supported by each Y block 39. By the movement of each X block 36 in the X direction, the Y base 37 can move in the X direction with respect to the X base 34. By the movement of each Y block 39 in the Y direction, the Z base 40 can move in the Y direction with respect to the Y base 37 or the X base 34.

In addition, a Z block hole 41 is formed in the center of the Z base 40, and a Z block 42 having an H-shaped section is loosely coupled to the Z block hole 41. The Z block 42 has a flange-shaped portion 43 therein and the flange-shaped portion 43 is thread-coupled with a ball screw 44 extending in the Z direction. The ball screw 44 is rotated around an axis by rotational force transmitted from a Z-axis motor 45 via a driving belt 46, and the flange-shaped portion 43 thread-coupled with the rotating ball screw 44 that moves in the Z direction. As a result, the Z block 42 moves in the Z direction along a guide, which is not shown. A plurality of actuators 47 is arranged on the upper surface of the flange-shaped portion 43. Each of the actuators 47 supports a substantially disk-shaped chuck base 49 through a roller ring 48. The roller ring 48 has a driving mechanism in the θ direction, which is not shown, and rotatably supports the chuck base 49 in the θ direction. The number of actuators 47 may be two or more. For example, three actuators 47 may be used, or two actuators 47 and one height-fixing support (not shown) may be used. The chuck base 49 is rotated in the θ direction by a structure which is not shown. The chuck base 49 has a chuck-top-adsorption surface 52, which is the central portion of the upper surface of the chuck base 49, and a bottom plate 53 of the chuck top 29 is vacuum-adsorbed to the chuck-top-adsorption surface 52. In this way, the chuck top 29 is mounted on and attached to the aligner 32. Further, the chuck base 49 has a plurality of height sensors 54 arranged on a peripheral portion of an upper surface of the chuck base 49, and a positioning pin 55 having a hemispherical upper end. Meanwhile, the chuck top 29 includes, at the lower surface of the chuck top 29, a plurality of detection plates 56 arranged at positions facing the respective height sensors 54, and a plurality of positioning blocks 57 arranged at positions facing the respective positioning pins 55.

When the chuck top 29 is mounted on the aligner 32, each height sensor 54 measures the distance from the upper surface of the chuck base 49 to the lower surface of the chuck top 29, which is a relative positional relationship between the chuck top 29 and the chuck base 49 (the aligner 32). Specifically, each height sensor 54 measures the distance from each of the height sensors 54 to a corresponding detection plate 56 (hereinafter, referred to as "chuck top height"). The measured height of each chuck top is stored in a memory of the controller 17d or the like. The chuck top height is measured for each height sensor 54. When the chuck top 29 is mounted on the aligner 32, due to factors such as inclination of the chuck-top-adsorption surface 52, the chuck top 29 may be incompletely parallel with the chuck base 49 and slightly inclined with respect to the chuck base 49. Thus, for example, even if the chuck top height measured by an arbitrary height sensor 54 is 500 μm, the chuck top height measured by another height sensor 54 may be 550 μm. In the wafer inspection device 10, the chuck top height measured by each height sensor 54 is stored in association with each height sensor 54.

The lower end of each positioning block 57 is formed into a conical shape and is engaged with the hemispherical upper end of the corresponding positioning pin 55. In the wafer inspection device 10, each positioning block 57 is engaged with a corresponding positioning pin 55 so that the position of the chuck top 29 relative to the chuck base 49 (the aligner 32) is defined.

Figure 5A:
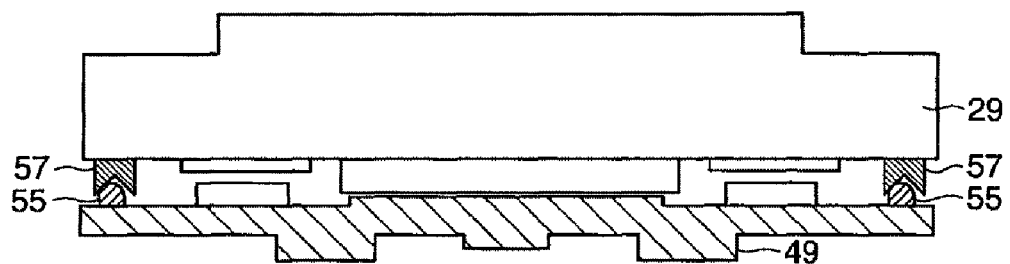
FIGS. 5A and 5B are process diagrams showing a positioning operation for defining a position of a chuck top with respect to an aligner.
Figure 5B:
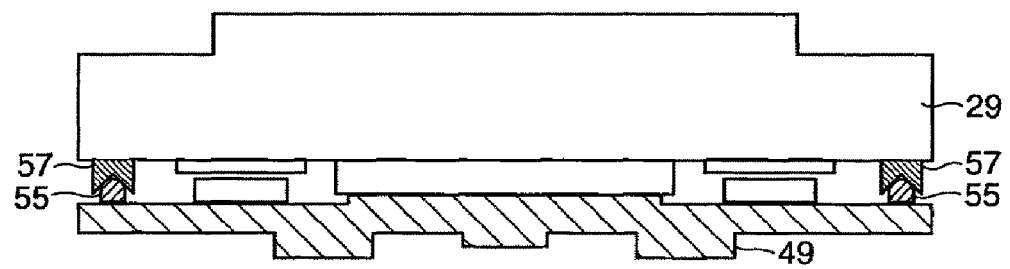

However, when the chuck top 29 is mounted on the aligner 32, there is a possibility that the lower ends of the positioning blocks 57 are partially in contact with the hemispherical upper ends of corresponding positioning pins 55 as shown in FIG. 5A, so that each positioning block 57 is not correctly engaged with the corresponding positioning pin 55. In this case, since the bottom plate 53 of the chuck top 29 is not in close contact with the chuck-top-adsorption surface 52 of the chuck base 49, the measured chuck top height does not accurately reflect the actual chuck top height, even though the chuck top height is measured by each height sensor 54. In the present embodiment, in response to this, after the chuck top 29 is mounted on the aligner 32, a positioning operation is performed to swing the chuck base 49 of the aligner 32 in at least one of the X direction, the Y direction, the Z direction, and the θ direction. By the positioning operation, the chuck base 49 deviates with respect to the chuck top 29 and the contact state between the lower end of each positioning block 57 and the hemispherical upper end of the corresponding positioning pin 55 is improved, thereby accurately engaging each positioning block 57 with the corresponding positioning pin 55 (see FIG. 5B). As a result, the bottom plate 53 can be brought into close contact with the chuck-top-adsorption surface 52. The positioning operation may be performed immediately after the chuck top 29 is mounted on the aligner 32. However, as long as the measured chuck top height has not yet been stored in the memory of the controller 17d or the like, the positioning operation may be performed immediately before a wafer inspection method is performed, which will be described later.

Returning to FIG. 4, the aligner 32 also has an upward confirmation camera 62 for confirming the degree of inclination of the probe card 19 or the pogo frame 20. The upward confirmation camera 62 is installed in the Z block 42. In the aligner 32, each actuator 47 lifts the chuck base 49, and the amount of lifting of each actuator 47 can be individually adjusted. That is to say, by making the amounts of lifting of actuators 47 different from each other, it is possible to adjust the inclination of the chuck base 49, and furthermore, the inclination of the chuck top 29.

Figure 6:
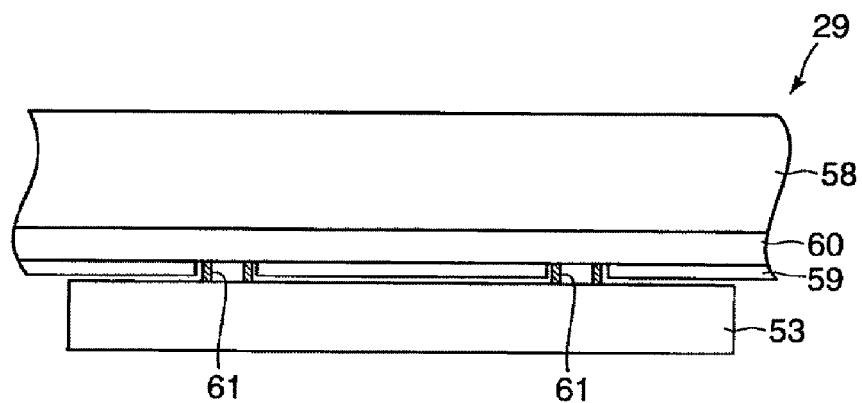
FIG. 6 is a view for explaining a heat-insulating structure of the chuck top in FIG. 3.

FIG. 6 is a view for explaining a heat-insulating structure of the chuck top in FIG. 3.

In FIG. 6, the chuck top 29 includes a main body 58 formed of a thick plate member, the bottom plate 53 disposed on the lower surface of the main body 58, and a cooler 60 and a heater 59 which are disposed between the bottom plate 53 and the main body 58. The bottom plate 53 is spaced apart from the main body 58, more specifically, from the cooler 60 and the heater 59, by a slight distance. The main body 58 and the bottom plate 53 are connected by a cylindrical heat-insulating collar 61. This prevents the cooler 60 from absorbing the heat of the aligner 32 through the bottom plate 53 and also prevents the heat of the heater 59 from being radiated to the aligner 32 through the bottom plate 53. Therefore, controllability of the temperature of the chuck top 29 can be improved. Since the heat-insulating collar 61 is interposed between the main body 58 and the bottom plate 53, it is possible to prevent the influence of thermal shrinkage or thermal expansion of the main body 58 by the cooler 60 or the heater 59 from being transmitted to the bottom plate 53. As a result, deformation of the bottom plate 53 can be suppressed, and therefore, the chuck top 29 can be stably adsorbed to the aligner 32.

Hereinafter, a wafer inspection method according to the present embodiment will be described.

In the wafer inspection device 10, when the wafer W is inspected, the wafer W mounted on the chuck top 29 is brought into contact with the probe card 19, and the chuck top 29 is adsorbed and held by the pogo frame 20 or the probe card 19 by evacuation or the like. Here, under a high-temperature or low-temperature inspection environment, there is a possibility that the chuck top 29 held as above is inclined due to an influence by thermal expansion or thermal shrinkage. In addition, the held chuck top 29 may also be inclined, when the chuck top 29 is adsorbed by the probe card 19 while the center of gravity of the chuck top 29 deviates with respect to the center of the probe card 19.

When the inspection of the wafer is completed, the aligner 32 approaches the probe card 19, and the chuck base 49 receives the wafer W together with the chuck top 29. In some cases, due to the inclination of the held chuck top 29, the relative positional relationship between the chuck top 29 and the chuck base 49 at the time of receiving the wafer W (specifically, each chuck top height at a position (predetermined position) where each height sensor 54 is arranged) is different from the chuck top height (hereinafter, referred to as "pre-held chuck top height") before the chuck top 29 is held by the probe card 19 or the like (that is to say, when the chuck top 29 is mounted on the aligner 32). In these cases, when the evacuation of the space S is completed and the chuck top 29 is lowered toward the chuck base 49, the chuck top 29 is locally brought into contact with the chuck base 49, and thus the chuck base 49 cannot appropriately receive the chuck top 29. In the present embodiment, in response to this, when the chuck base 49 receives the chuck top 29, each chuck top height is adjusted.

Figure 7:
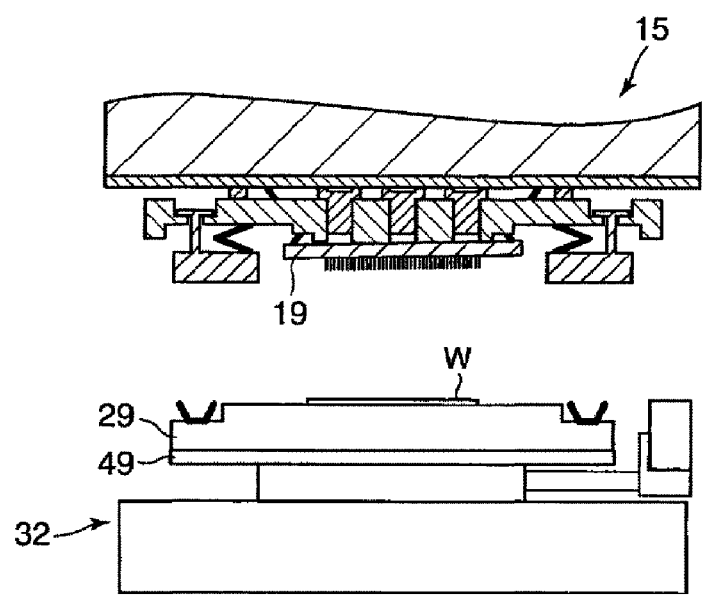

First, before the wafer inspection method to be described later is performed, the aligner 32 receives the chuck top 29 (see FIG. 7) and performs the above-described positioning operation to bring the bottom plate 53 of the chuck top 29 into close contact with the chuck-top-adsorption surface 52 of the chuck base 49 by vacuum adsorption. Further, each height sensor 54 of the chuck base 49 measures the pre-held chuck top height. Each of the measured chuck top heights is stored in the memory of the controller 17d or the like (storage operation). The positioning operation and the measurement of the pre-held chuck top height may be performed before the transfer stage 18 moves toward a certain tester 15 or when the chuck base 49 receives the chuck top 29 on which the wafer W is mounted after the inspection of the wafer W is performed.

FIGS. 8A to 8C and FIGS. 9A to 9C are process diagrams showing a wafer inspection method according to the present embodiment.

First, the chuck top 29 is adsorbed to the aligner 32, and each height sensor 54 measures a chuck top height. When the measured chuck top height is out of a preset allowable range, the adsorption of the chuck top 29 to the aligner 32 is stopped and the above-described positioning operation is performed. Subsequently, the chuck top 29 is again adsorbed to the aligner 32, and each height sensor 54 measures the chuck top height. This series of operations is repeated until the measured chuck top height reaches the preset allowable range. Thereafter, the aligner 32 is moved to determine the degree of inclination of the chuck top 29 using the tester-side camera 16 and determines the degree of inclination of the probe card 19 using the upward confirmation camera 62.

Figure 8A:
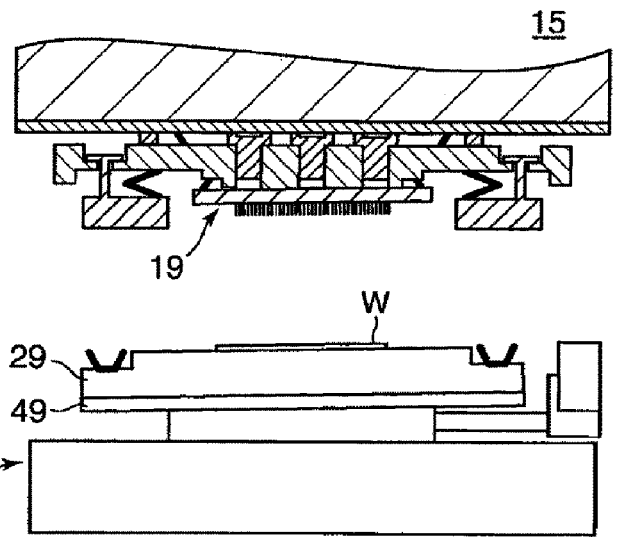
FIGS. 8A to 8C are process diagrams showing a wafer inspection method according to an embodiment of the present disclosure.
Figure 8B:
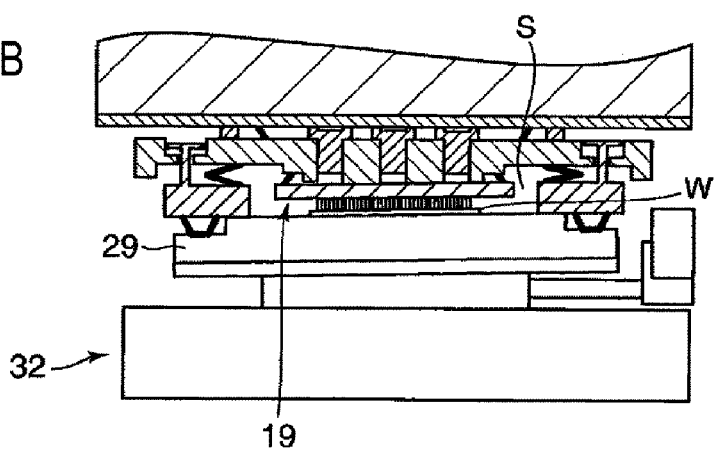

Subsequently, based on the determined degree of inclination of the chuck top 29 and the determined degree of inclination of the probe card 19, the degree of inclination of the chuck top 29 for keeping the wafer W in parallel with the probe card 19 is calculated, and the relative inclination of the chuck base 49 with respect to the probe card 19 is adjusted by each of the actuators 47 to realize the calculated degree of inclination of the chuck top 29 (see FIG. 8A). Thereafter, the aligner 32 moves the chuck top 29 toward the probe card 19 and bringing the wafer W into contact with the probe card 19 (see FIG. 8B). At this time, the space S is evacuated and the chuck top 29 is held by the probe card 19.

Figure 8C:
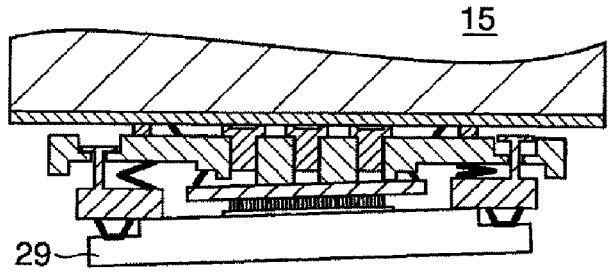

Subsequently, the close contact of the bottom plate 53 of the chuck top 29 and the chuck-top-adsorption surface 52 of the chuck base 49 is released and the aligner 32 is separated from the chuck top 29 (see FIG. 8C). Thereafter, the aligner 32 is retracted from below the tester 15 and the wafer W is inspected (inspection operation).

Figure 9A:
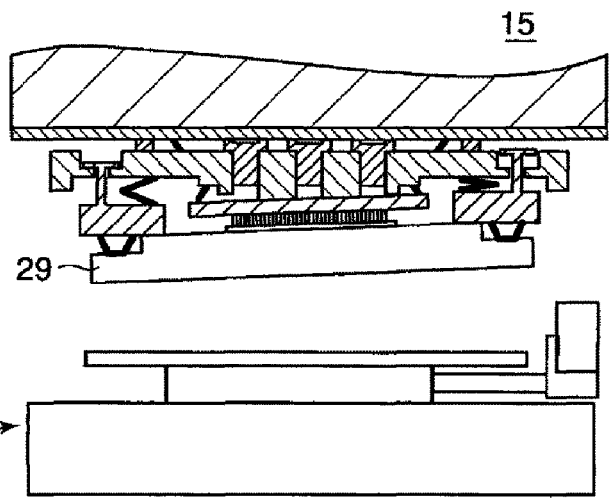
FIGS. 9A to 9C are process diagrams showing a wafer inspection method according to an embodiment of the present disclosure.
Figure 9B:
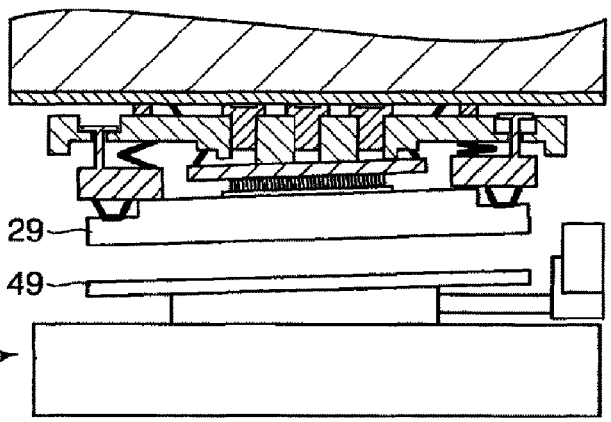
Figure 9C:
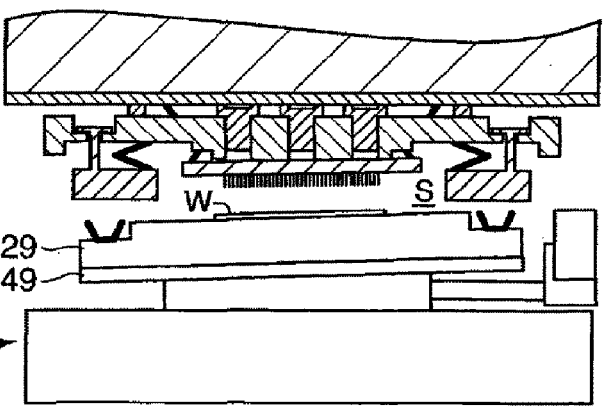
Figure 10A:
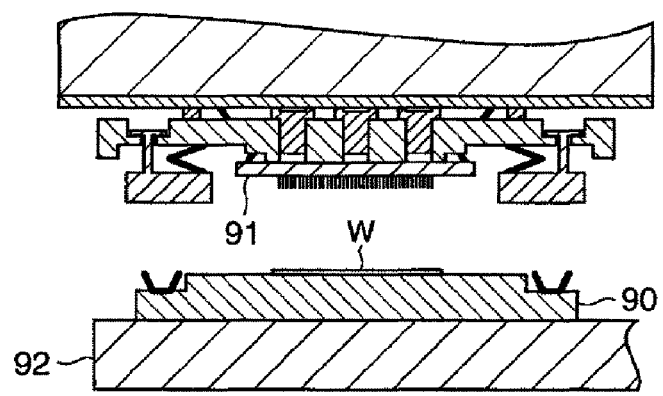
FIGS. 10A and 10B are process diagrams showing a method of installing a chuck top in a probe card in a conventional wafer inspection method.
Figure 10B:
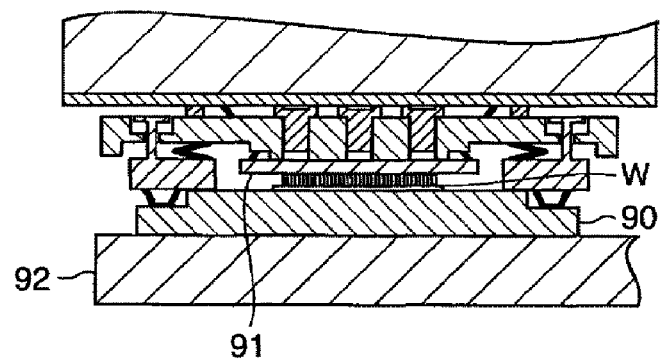
Figure 11A:
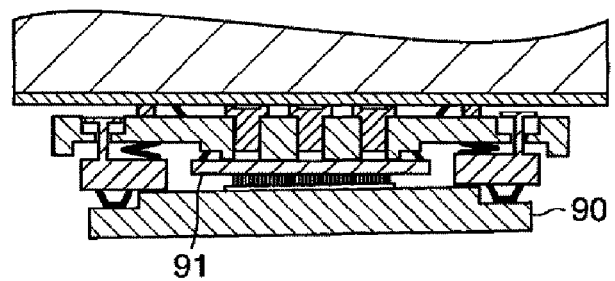
FIGS. 11A to 11C are process diagrams showing a method of receiving the chuck top in the conventional wafer inspection method.
Figure 11B:
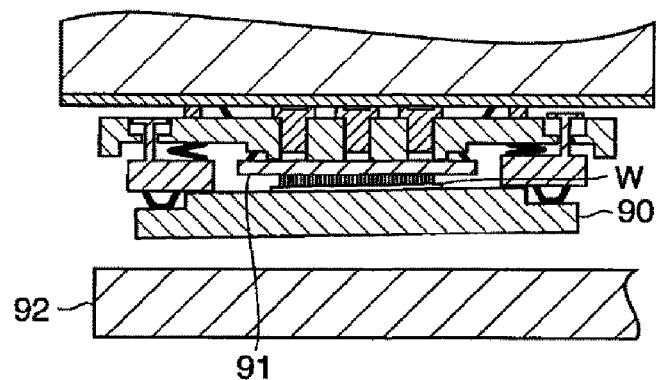
Figure 11C:
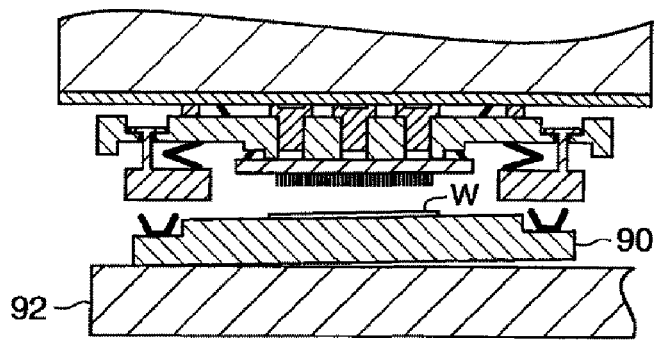

After the inspection of the wafer W is completed, the aligner 32 is moved below the tester 15 and faces the chuck top 29 (see FIG. 9A). Thereafter, the aligner 32 is moved toward the chuck top 29 held as above. When the chuck base 49 approaches the chuck top 29, each chuck top height is measured by a corresponding height sensor 54, and the distance between the chuck top 29 and the chuck base 49 is adjusted by adjusting the inclination of the chuck base 49 so that the measured chuck top height is set to a height obtained by uniformly adding a predetermined raising distance, for example, a value from 0 to 200 µm, to each stored pre-held chuck top height (see FIG. 9B) (adjustment operation). For example, when the predetermined raising distance is 50 µm, the distance between the chuck top 29 and the chuck base 49 is adjusted so that a chuck top height, which corresponds to a pre-held chuck top height of 500 µm measured by any one height sensor 54, becomes 550 µm, and a chuck top height, which corresponds to a pre-held chuck top height of 550 µm measured by another height sensor 54, becomes 600 µm. At this time, the differential relationship between the respective chuck top heights after the adjustment becomes equal to the differential relationship between the respective pre-held chuck top heights.

Subsequently, after each measured chuck top height is adjusted to the height obtained by uniformly adding the predetermined raising distance to each stored pre-held chuck top height, the contact state of the wafer W with the probe card 19 is released by releasing the vacuum state of the space S and the chuck top 29 is lowered toward the chuck base 49. Thus, the chuck base 49 receives the chuck top 29 together with the wafer W (reception operation), and the present method is terminated (see FIG. 9C).

According to the wafer inspection method of FIGS. 8A to 8C and FIGS. 9A to 9C, when the aligner 32 receives the chuck top 29 after the inspection of the wafer W is performed, the distance between the chuck top 29 and the chuck base 49 is adjusted based on the stored pre-held chuck top height. Specifically, the distance between the chuck top 29 and the chuck base 49 is adjusted so that each chuck top height, which is the distance between the held chuck top 29 and the chuck base 49, is set to the height obtained by uniformly adding the predetermined raising distance, which is a value from 0 to 200 µm, to each stored pre-held chuck top height. Thus, when the aligner 32 receives the chuck top 29 together with the wafer W, the relative positional relationship between the chuck top 29 and the chuck base 49 when the chuck top 29 is mounted on the aligner 32 can be reproduced. Specifically, the differential relationship between the respective chuck top heights after the adjustment can be made equal to the differential relationship between the respective pre-held chuck top heights. As a result, even if the chuck top 29 is lowered toward the chuck base 49, it is possible to prevent the chuck top 29 from making a local contact with the aligner 32, and thus the aligner 32 can appropriately receive the chuck top 29.

In addition, according to the wafer inspection method of FIGS. 8A to 8C and FIGS. 9A to 9C, the distance between the chuck top 29 and the chuck base 49 is adjusted so that each chuck top height, which is measured when the chuck top 29 is attracted and adsorbed by the probe card 19, is set to the height obtained by uniformly adding the predetermined raising distance, which is a value from 0 to 200 µm, to each pre-held chuck top height, rather than each stored pre-held chuck top height. Therefore, at the time of receiving the chuck top 29 by the chuck base 49, it is possible to secure an appropriate gap between the chuck base 49 and the chuck top 29, whereby it is possible to prevent the chuck top 29 from inadvertently coming into contact with the chuck base 49. In addition, since the added predetermined raising distance is a value from 0 to 200 µm, at the time of receiving the chuck top 29 by the chuck base 49, it is possible to prevent the chuck base 49 from being largely spaced apart from the chuck top 29, and thus it is possible to prevent a large amount of impact from being applied to the chuck top 29 when the chuck top 29 is lowered toward the chuck base 49.

In addition, when the chuck top 29 is mounted on the chuck base 49, there is a possibility that each positioning block 57 is not correctly engaged with a corresponding positioning pin 55 and thus the bottom plate 53 does not make close contact with the chuck-top-adsorption surface 52. In this case, even if the distance between the chuck top 29 and the chuck base 49 is adjusted based on each chuck top height, which is measured in the state in which the bottom plate 53 does not make close contact with the chuck-top-adsorption surface 52, when the aligner 32 receives the chuck top 29, the relative positional relationship between the chuck top 29 and the chuck base 49 when the bottom plate 53 makes close contact with the chuck-top-adsorption surface 52 cannot be reproduced. Therefore, in the present embodiment, the positioning operation is performed before each pre-held chuck top height is measured. With this configuration, it is possible to measure each chuck top height in the state in which the bottom plate 53 makes close contact with the chuck-top-adsorption surface 52, and thus it is possible to reliably reproduce, when the aligner 32 receives the chuck top 29 together with the wafer W, the relative positional relationship between the chuck top 29 and the chuck base 49 when the bottom plate 53 makes close contact with the chuck-top-adsorption surface 52 based on each measured chuck top height.

Although the present disclosure has been described above with reference to the embodiments, the present disclosure is not limited to the above-described embodiments.

In addition, aspects of the present disclosure can also be achieved by supplying a storage medium, in which a program code of software for realizing the functions of the above-described embodiments is recorded, to the controller 17d included in the wafer inspection device 10 and by reading and executing the program code stored in the storage medium by a CPU of the controller 17d.

In this case, the program code itself read from the storage medium realizes the functions of the above-described embodiments, and the program code and the storage medium storing the program code are elements of the present disclosure.

As the storage medium for supplying the program code, mediums capable of storing the program code, for example, an RAM, an NV-RAM, a floppy (registered trademark) disk, a hard disk, a magneto-optical disk, an optical disk such as CD-ROM, CD-R, CD-RW, or DVD (DVD-ROM, DVD-RAM, DVD-RW, or DVD+RW), a magnetic tape, a non-volatile memory card, other types of ROM, and the like may be used. Alternatively, the program code may be downloaded from another computer or a database, which is not shown and connected via the Internet, a commercial network, or a local area network, and supplied to the controller 17d.

The functions of the above-described embodiments may be realized by executing the read program code by the controller 17d. Also, an Operating System (OS) or the like, which operates on the CPU, may execute parts or the entire actual processing based on instructions of the program code. The functions of the above-described embodiments may be also realized by the processing.

In addition, the program code read from the storage medium may be written in a memory provided in a function expansion board inserted into the controller 17d or a function expansion unit connected to the controller 17d, and a CPU or the like provided in the function expansion board or the function expansion unit may perform parts or the entire actual processing based on the instructions in the program code. The functions of the above-described embodiments may be also realized by the processing.

The program code may be in the form of an object code, a program code executed by an interpreter, script data supplied to an OS, or the like.

This international application claims priority based on Japanese Patent Application No. 2015-194390 filed on Sep. 30, 2015, the entire contents of which are hereby incorporated by reference.

| EXPLANATION OF REFERENCE NUMERALS | |
| --- | --- |
| W: wafer | 10: wafer inspection device |
| 18: transfer stage | 19: probe card |
| 29: chuck top | 32: aligner |
| 49: chuck base | 54: height sensor |

What is claimed is:

1. A wafer inspection method in which a wafer mounted on a chuck top is brought into contact with a probe card having a plurality of contact terminals, comprising:
storing, before the wafer is in contact with the probe card, a relative positional relationship between the chuck top and an aligner, which adjusts an inclination of the chuck top, when the chuck top is attached to the aligner;
inspecting the wafer by moving the chuck top so that the wafer makes contact with the probe card;
adjusting, after inspecting the wafer, a distance between the aligner and the chuck top, on which the wafer in contact with the probe card is mounted, based on the relative positional relationship stored; and
receiving, by the aligner, the chuck top together with the wafer.

2. The wafer inspection method of claim 1, wherein the aligner has a chuck base on which the chuck top is mounted,
wherein storing the relative positional relationship includes storing a relative positional relationship between the chuck top and the chuck base when the chuck top is mounted on the chuck base, and
wherein adjusting the distance between the aligner and the chuck top includes inclining the chuck base so that a distance between the chuck top, on which the wafer in close contact with the probe card is mounted, and the chuck base is adjusted based on the relative positional relationship stored.

3. The wafer inspection method of claim 2, wherein the relative positional relationship stored is a distance between the chuck top and a predetermined position of the chuck base when the chuck top is mounted on the chuck base, and
wherein adjusting the distance between the aligner and the chuck top includes inclining the chuck base so that the distance between the chuck top, on which the wafer in contact with the probe card is mounted, and the predetermined position of the chuck base is set to a distance obtained by adding a predetermined raising distance to the distance between the chuck top and the predetermined position of the chuck base when the chuck top is mounted on the chuck base.

4. The wafer inspection method of claim 3, wherein the predetermined raising distance is a value from 0 to 200 μm.

5. The wafer inspection method of claim 1, further comprising:
before adjusting the distance between the aligner and the chuck top, measuring the relative positional relationship between the aligner and the chuck top, on which the wafer in contact with the probe card, is mounted.

6. The wafer inspection method of claim 3, wherein, after the distance between the chuck top, on which the wafer in contact with the probe card is mounted, and the predetermined position of the chuck base is set to the distance obtained by adding the predetermined raising distance to the distance between the predetermined position of the chuck top and the chuck base when the chuck top is mounted on the chuck base, a contact state of the wafer with the probe card is released, the chuck top is lowered toward the chuck base, and the chuck base receives the chuck top together with the wafer.

7. The wafer inspection method of claim 2, further comprising:
before storing the relative positional relationship, mounting the chuck top on the chuck base and positioning the chuck top with respect to the chuck base.

8. A wafer inspection device in which a wafer mounted on a chuck top is brought into contact with a probe card having a plurality of contact terminals, comprising:
an aligner configured to adjust an inclination of the chuck top; and
a sensor configured to measure a relative positional relationship between the chuck top and the aligner, wherein the aligner is allowed to be separated from the chuck top, wherein the sensor measures, before the wafer makes contact with the probe card, the relative positional relationship between the aligner and the chuck top when the chuck top is attached to the aligner, wherein the probe card inspects the wafer when the chuck top is moved so that the wafer is in contact with the probe card, and wherein the aligner receives, after the wafer is inspected, the chuck top together with the wafer by adjusting a distance between the chuck top, on which the wafer in contact with the probe card is mounted, and the aligner based on the relative positional relationship measured.

9. The wafer inspection device of claim 8, wherein the aligner has a chuck base on which the chuck top is mounted, wherein the sensor measures a relative positional relationship between the chuck top and the chuck base when the chuck top is mounted on the chuck base, and wherein the aligner is configured to incline the chuck base so that a distance between the chuck top, on which the wafer in contact with the probe card is mounted, and the chuck base is adjusted based on the relative positional relationship measured.

10. The wafer inspection device of claim 8, further comprising:

a plurality of probe cards; and a stage configured to move the chuck top toward the probe card.

* * * * *